(12) United States Patent
Watts

(10) Patent No.: US 7,286,008 B2
(45) Date of Patent: Oct. 23, 2007

(54) DIGITAL AMPLIFIER

(75) Inventor: Robert Watts, Swn Yr Awel, Llanddarog, Carmarthen (GB) SA32 8BJ

(73) Assignees: Robert Watts, Llanddarog (GB); Zetex Semiconductors Plc, Chadderton (GB)

( * ) Notice: Subject to any disclaimer, the term of this patent is extended or adjusted under 35 U.S.C. 154(b) by 156 days.

(21) Appl. No.: 11/262,512

(22) Filed: Oct. 28, 2005

(65) Prior Publication Data

US 2006/0125555 A1   Jun. 15, 2006

(30) Foreign Application Priority Data

Nov. 1, 2004   (GB) ................. 0424122.0

(51) Int. Cl.
*H03F 3/38* (2006.01)
(52) U.S. Cl. .................... 330/10
(58) Field of Classification Search .......... 381/83, 381/121
See application file for complete search history.

(56) References Cited

U.S. PATENT DOCUMENTS

| | | | |
|---|---|---|---|
| 5,777,512 A | 7/1998 | Tripathi | |
| 5,974,089 A * | 10/1999 | Tripathi et al. | ............. 375/247 |
| 6,300,825 B1 * | 10/2001 | Dijkmans et al. | ............. 330/10 |
| 6,646,502 B1 | 11/2003 | Kruiskamp | |
| 7,157,969 B2 * | 1/2007 | Candy | ....................... 330/251 |
| 2004/0046680 A1 | 3/2004 | Masuda | |
| 2004/0131193 A1 | 7/2004 | Kitamura | |
| 2004/0165661 A1 | 8/2004 | Braun | |
| 2007/0040608 A1 * | 2/2007 | Magrath et al. | ............. 330/10 |

FOREIGN PATENT DOCUMENTS

| | | |
|---|---|---|
| WO | WO 02/078179 A2 | 10/2002 |
| WO | WO 02/089321 | 11/2002 |
| WO | WO 2004/049561 A1 | 6/2004 |

* cited by examiner

*Primary Examiner*—Robert Pascal
*Assistant Examiner*—Alan Wong
(74) *Attorney, Agent, or Firm*—Krieg DeVault LLP; L. Scott Paynter

(57) ABSTRACT

A digital amplifier (1) comprising a first modulation stage (9) arranged to receive a digital data signal and to generate a corresponding modulated reference signal; a comparator (12) arranged to receive a feedback signal and the modulated reference signal and generate a corresponding error signal (13) indicative of a difference between the modulated reference signal and the feedback signal; an integration stage (44) arranged to integrate the error signal (13) from the comparator (12) to generate an integrated digital error signal; a summer (19) arranged to receive the integrated digital error signal and the digital data signal (8) and generate an adjusted digital data signal indicative of their sum; an output stage comprising a second modulation stage, the output stage being arranged to receive the adjusted digital data signal and to generate a corresponding modulated output signal for driving a load (7); and a feedback circuit arranged to provide said feedback signal to the comparator (12), the feedback signal being indicative of the modulated output signal.

18 Claims, 1 Drawing Sheet

DIGITAL AMPLIFIER

CROSS-REFERENCE TO RELATED APPLICATIONS

Figure 1:
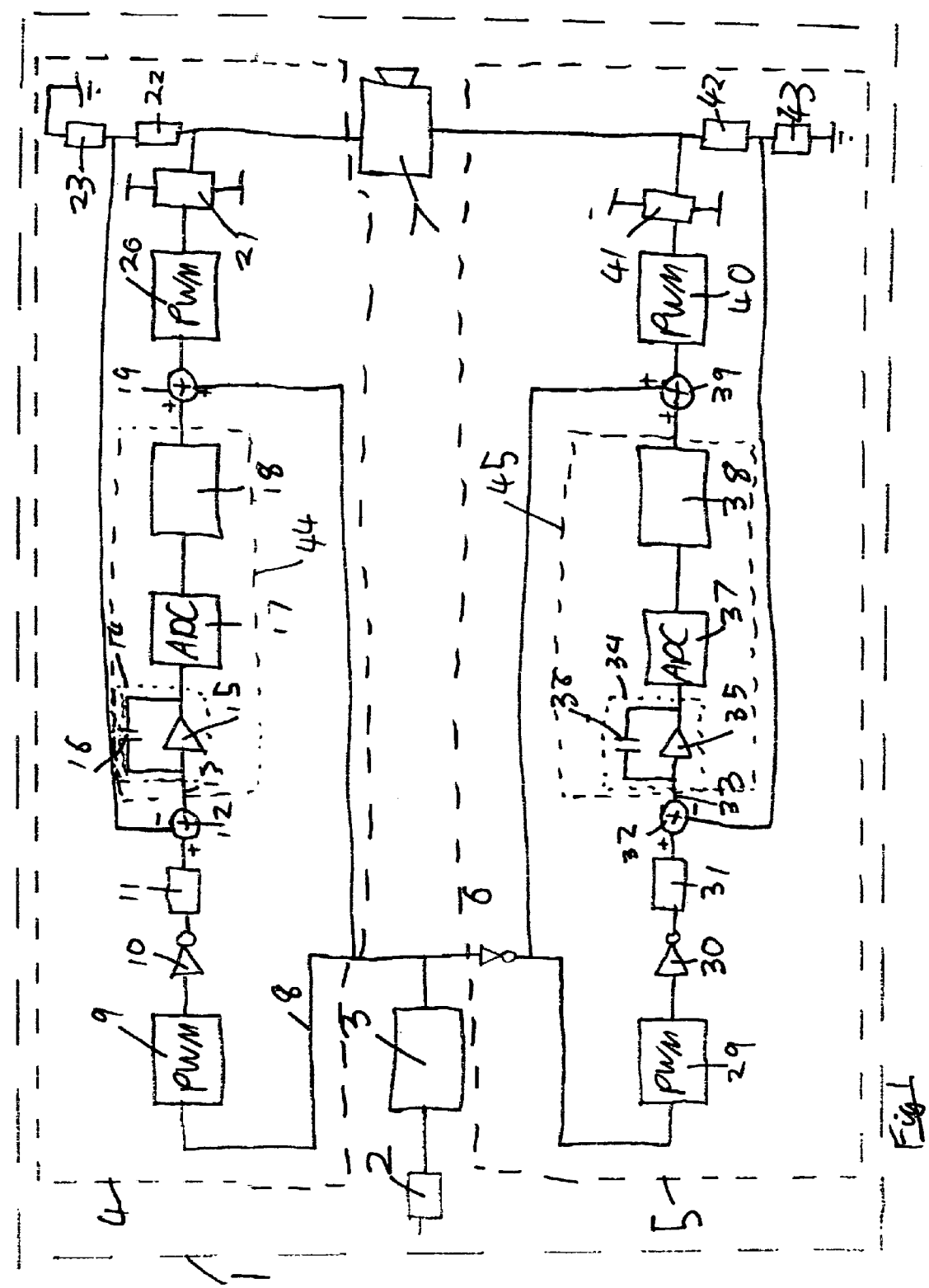

The present application claims priority to British Patent Application No. 0424122.0 filed in the United Kingdom on 1 Nov. 2004.

The present invention relates to digital amplifiers, and in particular, although not exclusively, to audio power amplifiers.

Audio amplifier systems have traditionally used linear (class A or class AB) amplifiers. Linear amplifiers are, however, inherently inefficient. Heat dissipation and power supply requirements of linear amplifiers can be particularly problematical in modern electronic consumer products such as personal computers and multi-media systems. This has lead to the development of various alternative approaches to audio amplification.

One such approach is the "switching", or class D amplifier. Essentially, class D amplifiers work by varying the duty cycle of a pulse width modulated (PWM) signal. A class D amplifier comprises a continuous time pulse width modulator coupled between audio input and power output stages. The pulse width modulator comprises a comparator, which receives the input audio signal and a reference carrier signal, which continuously varies at the desired switching frequency (typically ten times the highest frequency of the desired audio output).

The reference signal can be any periodic signal, but is usually a continuous triangular wave (typically plus or minus 1 volt, i.e. 2 volts peak to peak). The output of the modulator is a rapidly switching square wave, which is fed to the output stage. The output stage transistors (typically power MOSFETs in a H-bridge configuration) therefore operate the majority of the time either fully on or fully off (ideally never operating in mid conduction) which reduces power dissipation and increases efficiency. The resulting output signal is a rapidly switching square wave with a duty cycle proportional to the amplitude of the input audio signal. This may then be supplied to a speaker, via an output filter circuit if appropriate.

Conventional class D amplifiers have a very high efficiency but relatively poor distortion and noise performance and thus relatively poor sound quality.

An alternative type of amplifier with improved performance is the delta-sigma amplifier. A delta-sigma amplifier may have an output stage identical to that of a conventional class D amplifier but differs in that delta-sigma modulation is used rather than continuous PWM. In particular, a feedback structure is used to improve performance. Thus, a typical delta-sigma amplifier comprises a time-quantised comparator with a feedback path from the comparator output to a subtractor at which the output is compared to the audio input. The output of the subtractor is supplied to an integrator stage, the output of which is input into the comparator. The integrator integrates the error voltage so that the system constantly minimises the error by adjusting the output data stream.

A simple first order delta-sigma modulator comprises a single integrator. It is known to improve upon the performance of a delta-sigma modulator by using more than one integrator, but such higher order modulators can become difficult to stabilise. In particular, the tap coefficients needed to stabilise an $n^{th}$ order delta-sigma modulator reduce the effectiveness of the feedback so that little benefit is gained by employing greater than $4^{th}$ order.

Although improving on the performance of conventional class D amplifiers, delta-sigma amplifiers nevertheless suffer from significant distortion and noise, principally due to the time sampling of the quantiser.

A class D amplifier with a feedback loop similar to that of a delta-sigma amplifier has been proposed. Essentially this employs a first order integration stage which outputs to a time continuous pulse width modulator. However, the majority of class D power amplifiers are open loop. That is they do not provide corrective feedback.

For open loop class D amplifiers distortion and noise performance depends upon the modulator (typically a pulse width modulator), the output stage (including the drivers) and the power supply. Although high performance modulators may be relatively easily obtained it is difficult to supply output stages and power supplies of sufficient quality for low signal to noise ratio (SNR) audio amplifiers. It is for this reason that the performance is not better than the best linear amplifiers. To obtain very low distortion performance, of the order of 0.01% of the output signal, very high demands are placed on the output stage. Large shoot through currents through the drive transistors for the output stage are required, significantly degrading the efficiency of the amplifier. High speed/high accuracy drivers are needed, together with output FET transistors that have low $R_{DS-ON}$ resistance linearity with current. To obtain high performance for the power supply requires low noise and very low power supply impedance (of the order of 1 mΩ).

PCT publication number WO02/089321 discloses a signal processing circuit that may be operated as a digital amplifier comprising a difference stage for receiving an input signal to be processed and a feedback signal taken from an output of the circuit. The difference stage generates a difference signal corresponding to the difference between the input and the feedback signal. An integrator stage is coupled to the difference stage to receive the difference signal and output an integrated signal. A time continuous pulse width modulating stage is coupled to the integrator stage to receive the integrated signal and to modulate the signal with reference to a continuously varying carrier signal. A continuous time feedback path is coupled to the output of the modulating signal and an input of the difference stage. The integrator stage comprises at least two integrators to provide second or higher order integration.

However, this digital amplifier operates with analogue inputs and outputs, and consequently does not provide digital feedback. Furthermore, all the integrator stages are analogue, and it only provides a single noise shaper stage (i.e. the PWM stage).

U.S. Pat. No. 6,646,502 discloses a class D amplifier accepting a digital input signal which is then converted by a first delta-sigma modulator to provide a first multivalue digital signal representing the desired output. This first multivalue digital signal is combined with a second multivalue digital signal provided by a second delta-sigma modulator to provide a third multivalue digital signal. This third multivalue digital signal is converted to binary digital output signals for differentially driving a load. These binary digital output signals are also fed back and combined with the first multivalue digital signal to provide the feedback signal for the second delta-sigma modulator.

However, this amplifier is designed to work at a switching frequency of 10 MHz. This frequency is far too high for high power applications. Additionally, the secondary noise shaper is second order, which, were it to be used at 1 MHz (a more typical switching frequency for high power applications) would result in unacceptable distortion and noise performance. This is due to the lack of resolution in the output and because second order integration is insufficient for low switching speeds. The amplifier disclosed by U.S. Pat. No. 6,646,502 is primarily suitable for low power audio devices. It is not suitable for higher power audio (of the order of 150 W per channel). For high power applications a low switching speed is required to avoid undue losses within the switching elements in the output stage.

It is an object of the present invention to obviate or mitigate one or more of the above disadvantages.

In particular, it is an aim of embodiments of the present invention to provide a digital amplifier providing performance comparable with, or better than, the best linear amplifiers. This implies distortion of the order of 0.01% or better. Furthermore it is an aim of embodiments of the present invention to eliminate the need for large shoot through currents, high speed drivers and output stages, and regulated power supplies (requiring a power supply rejection ratio of the order of 100 dB).

According to the present invention there is provided a digital amplifier comprising:
- a first modulation stage arranged to receive a digital data signal and to generate a corresponding modulated reference signal;
- a comparator arranged to receive a feedback signal and the modulated reference signal and generate a corresponding error signal indicative of a difference between the modulated reference signal and the feedback signal;
- an integration stage arranged to integrate the error signal from the comparator to generate an integrated digital error signal;
- a summer arranged to receive the integrated digital error signal and the digital data signal and generate an adjusted (in effect, a corrected) digital data signal indicative of their sum;
- an output stage comprising a second modulation stage, the output stage being arranged to receive the adjusted digital data signal and to generate a corresponding modulated output signal for driving a load; and
- feedback means arranged to provide said feedback signal to the comparator, the feedback signal being indicative of the modulated output signal.

Preferably, the integration stage comprises at least three integrators arranged to provide at least third order integration of the error signal. These at least three integrators may all be digital, or alternatively may be a combination of analogue and digital integrators.

In certain preferred embodiments the second modulation stage operates at a switching frequency within the range 0 Hz-4 MHz, and in others within the range 200 kHz-4 MHz.

Amplifiers embodying the invention may further comprise a digital noise shaper adapted to receive a digital input signal and to noise-shape the digital input signal and provide the noise-shaped signal to the first modulation stage as the digital data signal.

In certain preferred embodiments, the first modulation stage comprises a pulse width modulator and the modulated reference signal is a pulse width modulated signal. The second modulation stage may also comprise a pulse width modulator and the modulated output signal may be a pulse width modulated signal.

The first modulation stage may comprise a modulator, arranged to receive the digital data signal, and an inverter arranged to invert the modulator output.

In certain preferred embodiments the second modulation stage is arranged to generate a modulated control signal corresponding to the adjusted digital data signal, and the output stage further comprises switching means arranged so as to be controlled by the modulated control signal.

The modulated output signal may be a modulated output voltage for application to one side of a load.

Advantageously, the integration stage comprises a first analogue integrator arranged to integrate the error signal, an analogue to digital converter (ADC) arranged to convert an analogue output of the first analogue integrator to a digital signal, and two digital integrators arranged in series to integrate the digital signal from the ADC.

Thus, the integration stage may comprise a combination of analogue and digital integrators, i.e. it may include at least one analogue integrator, an analogue to digital converter, and at least one digital integrator. Alternatively, the integration stage may comprise only digital integrators, and preferably at least three.

In embodiments comprising an ADC to convert the output of an analogue integrator/integration stage, the ADC preferably provides at least 10 bit resolution, and ideally of the order of 14 bit resolution.

In certain preferred embodiments the modulated output signal is a modulated voltage, and the feedback means comprises a voltage divider, arranged such that the feedback signal is a voltage signal proportional to the output voltage.

In further preferred embodiments, he modulated output signal is a modulated output voltage for application to one side of a load, and the amplifier further comprises:
- an inverter arranged to invert the digital data signal
- a third modulation stage arranged to receive the inverted digital data signal and to generate a corresponding second modulated reference signal;
- a second comparator arranged to receive a second feedback signal and the second modulated reference signal and generate a corresponding second error signal indicative of a difference between the second modulated reference signal and the second feedback signal;
- a second integration stage arranged to integrate the second error signal from the second comparator to generate a second integrated digital error signal;
- a second summer arranged to receive the second integrated digital error signal and the inverted digital data signal and generate a second adjusted (corrected) digital data signal indicative of their sum;
- a second output stage comprising a fourth modulation stage, the second output stage being arranged to receive the second adjusted digital data signal and to generate a corresponding second modulated output signal for driving a load; and
- second feedback means arranged to provide said second feedback signal to the second comparator, wherein the second modulated output signal is a second modulated voltage for application to a second side of the load, and the second feedback signal is indicative of the second modulated voltage.

The first and second output stages may comprise an H-bridge circuit for driving an output load.

An advantage of the present invention is that by comparing the output signal to a reference signal which corresponds to the desired output, integrating the error signal and then adding this to the digital input signal, distortion performance of the order of 0.001% can be achieved, with high efficiency output stages.

The present invention will now be described, by way of example only, with reference to the accompanying drawing, which schematically represents a digital amplifier in accordance with the present invention.

The digital amplifier operates by generating a reference signal, corresponding to the desired output signal, from the digital input signal, and comparing this reference signal with the actual output signal to generate an error signal. This error signal is then further processed and combined with the original digital input signal and passed to a conventional pulse width modulation stage to drive the output stage. If the output is too low then the error becomes positive thereby increasing the output. If the output is too high, the error signal goes negative, hence decreasing the output. In the described embodiment, each side of the bridge is individually compared, i.e. two error signals are used, one derived from the high side of the output, and one from the low side.

In the described digital amplifier the feedback is global in the sense that it encompasses the whole of the amplifier from the input stage to the output stage. This is in contrast to conventional delta-sigma amplifiers for which feedback only encompasses the modulator. Additionally, the amplifier may operate as a single sided amplifier, or alternatively the output may be driven by a H-bridge with the H-bridge driven by two complementary signal processing stages. For each of the complementary signal processing stages an error signal is individually generated.

Referring now to FIG. 1, a digital input signal is supplied to the amplifier by input stage 2. The digital input signal is supplied to a primary digital noise shaper 3, which may be of any form conventional in the art. The primary digital noise shaper 3 generates a 7 bit noise shaped output, which is updated at a first switching frequency. In certain preferred embodiments this first frequency is 843.75 kHz, and this may conveniently be derived from a master clock frequency of 108 MHz. Clocks operating at this frequency are commercially available. It will be appreciated, however, that the first frequency, in alternative embodiments, may have different values. For example, the first frequency may be in the range 400 kHz to 8 MHz The output of the primary digital noise shaper 3 comprises noise shaped data, and is fed to each complementary signal processing stage 4 and 5. The signal passed to signal processing stage 5 is first passed through an inverter 6. This allows the output of signal processing stage 4 to drive the high side of a H-bridge driving the output 7 (which in certain embodiments is a loudspeaker as shown) and the output of signal processing stage 5 to drive the low side of the H-bridge. The H-bridge comprises conventional output stages 21 and 41 forming part of complementary signal processing stages 4 and 5 respectively.

The signal supplied to signal processing stage 4 on line 8 is fed to a first modulation stage 9. First modulation stage 9 comprises a pulse width modulator, which converts the noise shaped digital input signal to a PWM signal. The pulse width modulator 9 operates at a lower switching frequency than the primary digital noise shaper 3. It typically operates at half the switching frequency of the primary digital noise shaper 3, i.e. between 200 kHz and 4 MHz. Thus, the output of the primary noise shaper may be updated at twice the PWM switching frequency. The detail of the pulse width modulator 9 may be entirely conventional, and as such will not be further described here.

The PWM signal is inverted by inverter 10 and fed via resistor 11 to difference stage 12. The signal passed to difference stage 12 thus comprises a first modulated digital reference signal. The first digital reference signal is indicative of the desired digital output signal, i.e. it represents what the true digital output signal should be. By comparison with the true output any error may be counteracted, such that inaccuracies in the power supply or the output stages may be removed. In order to achieve this, difference stage 12 further receives a first feedback signal and compares this to the first reference signal to generate a first error signal, which is output on line 13. The first error signal is passed to an integration stage 44. Integration stage 44 comprises an analogue integrator 14 and a digital integration stage 18. Analogue integrator 14 comprises an op-amp 15 and capacitor 16. The output of analogue integrator 14 is fed to an analogue to digital converter (ADC) 17, which generates a high resolution digital signal. The resolution of the digital signal may be 14 bits in certain embodiments, or even greater.

The digitised signal is passed to at least two further integrators, making a total of at least three integrations performed on the error signal. At least three integrators are required to obtain the desired signal to noise, distortion and power supply rejection ratio for a high quality digital amplifier operating at a relatively low switching speed. The three integrations may be provided by any combination of digital and/or analogue integrators, and each integrator may be of any form that is known in the art. In the illustrated embodiment the digitised signal (from ADC 17) is passed to three further integrators, all of which are digital, schematically illustrated as being grouped together in digital integration stage 18. It is advantageous for these three integrators 18 to all be digital to reduce the number of required input and output pins if the amplifier is fabricated as an integrated circuit using a standard digital CMOS process.

The output of digital integration stage 18 can be regarded as a first noise shaped error signal. This is added to the original noise shaped data from primary digital noise shaper 3 in summer stage 19. In this example, summer stage 19 also truncates the signal to 8 bits. The signal is then passed to a second modulation stage 20, comprising a pulse width modulator. The pulse width modulator 20 utilises rising and falling edges of the master clock to encode an extra least significant bit of data. The signal is then passed to a conventional output stage 21, which delivers current to the output load 7.

The signal from the output stage 21 forms the first feedback signal, which is supplied to difference stage 12. The gain of the feedback signal is determined by resistors 22 and 23, which form a potential divider between the output stage 21 and a ground connection, together with resistor 11.

Signal processing stage 5 provides a duplicate of signal processing stage 4, except that it operates on an inverted noise shaped signal from the primary digital noise shaper. The signal passes through modulation stage 29, inverter 30, and resistor 31 to difference stage 32 where it comprises a second digital reference signal. This is compared to a second feedback signal, to provide a second error signal output on line 33. This second error signal is then processed by integration stage 45. Integration stage 45 comprises analogue integrator 34, which comprises op-amp 35 and capacitor 36, ADC 37 and digital integration stage 38. The signal is then added to the inverse of the original digital input signal in summer 39. The resultant signal is then truncated to 8 bits and modulated by modulation stage 40, which comprises a pulse width modulator in order to drive output stage 41.

A pulse width modulator 40 operating at a switching frequency of between 200 kHz and 4 MHz has been shown to provide satisfactory signal to noise performance. Gain for the second feedback signal is provided by resistors 41, 42 and 43.

Alternatively, the present invention may operate as a single sided system, with the other side of the load connected to ground. However, it is advantageous to operate with two sides as this halves the voltage applied across the transistor switches within the output stages 21, 31.

Unlike with other forms of feedback, the output PWM pulses are totally reconstructed. This allows for variation in the supply voltage, while maintaining the average voltage supplied to the output. The error signal has the capacity to vary between full positive 100% modulation and full negative 100% modulation, and within these limits any gain, power supply setting or output stage non linearity can be accommodated.

Because of the use of third order, or higher, integration and the high resolution PWM output, very high levels of correction are achievable. A power supply rejection ratio of 100 dB or greater is achievable, with distortion and noise at high output powers below 0.001%. Moreover, because 100 dB of feedback is used the output stage can have very low shoot through currents, and can have poor open loop distortion performance without affecting the performance of the amplifier.

In addition to the reduction in the number of input and output pins, benefits of using digital integrators in embodiments of the invention are lower cost, as silicon die size is much smaller for a digital integrator compared with an op-amp, and higher performance and reliability, as digital integrators are not subject to parasitics, drift or tolerance problems.

In the embodiment described above the first integrator is analogue, followed by an analogue to digital converter and then digital integrators. In alternative embodiments the analogue to digital converter may be placed at the beginning, allowing for all-digital integration (e.g. using a series of three digital integrators). However, this places a higher demand on the performance of the ADC. For example, it may be necessary to use an ADC with 18 bit resolution and noise performance to obtain satisfactory performance overall. In contrast, the three or more integrations could be provided by two or more analogue integrators followed by an ADC and one or more digital integrators. Such an arrangement would further relax the requirements for the ADC.

It will be appreciated that although certain preferred embodiments of the invention are audio amplifiers, the invention is not limited to audio applications. Amplifiers embodying the invention may, for example, be used in alternative applications in which the input signal is digital, and in which a high power, high accuracy analogue output is required.

Further applications and modifications of the present invention will be readily apparent to the appropriately skilled person.

The invention claimed is:

1. A digital amplifier comprising:
a first modulation stage arranged to receive a digital data signal and to generate a corresponding modulated reference signal;
a comparator arranged to receive a feedback signal and the modulated reference signal and generate a corresponding error signal indicative of a difference between the modulated reference signal and the feedback signal;
an integration stage arranged to integrate the error signal from the comparator to generate an integrated digital error signal;
a summer arranged to receive the integrated digital error signal and the digital data signal and generate an adjusted digital data signal indicative of their sum;
an output stage comprising a second modulation stage, the output stage being arranged to receive the adjusted digital data signal and to generate a corresponding modulated output signal for driving a load; and
a feedback circuit arranged to provide said feedback signal to the comparator, the feedback signal being indicative of the modulated output signal.

2. A digital amplifier according to claim 1, wherein the integration stage comprises at least three integrators arranged to provide at least third order integration of the error signal.

3. A digital amplifier according to claim 1, wherein the second modulation stage operates at a switching frequency within the range 0 Hz-4 MHz.

4. A digital amplifier according to claim 1, further comprising a digital noise shaper adapted to receive a digital input signal and to noise-shape said digital input signal and provide the noise-shaped signal to the first modulation stage as said digital data signal.

5. A digital amplifier according to claim 1, wherein the first modulation stage comprises a pulse width modulator and the modulated reference signal is a pulse width modulated signal.

6. A digital amplifier according to claim 1, wherein the second modulation stage comprises a pulse width modulator and the modulated output signal is a pulse width modulated signal.

7. A digital amplifier according to claim 1, wherein the first modulation stage comprises a modulator, arranged to receive the digital data signal, and an inverter arranged to invert the modulator output.

8. A digital amplifier according to claim 1, wherein said second modulation stage is arranged to generate a modulated control signal corresponding to the adjusted digital data signal, and the output stage further comprises a switching circuit arranged so as to be controlled by the modulated control signal.

9. A digital amplifier according to claim 1, wherein said modulated output signal is a modulated output voltage for application to one side of a load.

10. A digital amplifier according to claim 1, wherein the integration stage comprises a first analogue integrator arranged to integrate the error signal, an analogue to digital converter (ADC) arranged to convert an analogue output of the first analogue integrator to a digital signal, and two digital integrators arranged in series to integrate the digital signal from the ADC.

11. A digital amplifier according to claim 1, wherein the integration stage comprises at least three digital integrators.

12. A digital amplifier according to claim 1, wherein the integration stage comprises at least one analogue integrator, an analogue to digital converter, and at least one digital integrator.

13. A digital amplifier according to claim 12, wherein the integration stage comprises at least two digital integrators.

14. A digital amplifier according to claim 10, wherein the analogue to digital converter provides at least 10 bit resolution.

15. A digital amplifier according to claim 14, wherein the analogue to digital converter provides at least 14 bit resolution.

16. A digital amplifier according to claim 1, wherein the modulated output signal is a modulated voltage, and the feedback circuit comprises a voltage divider, arranged such that the feedback signal is a voltage signal proportional to said output voltage.

17. A digital amplifier according to claim 1, wherein the modulated output signal is a modulated output voltage for application to one side of a load, the amplifier further comprising:

an inverter arranged to invert the digital data signal a third modulation stage arranged to receive the inverted digital data signal and to generate a corresponding second modulated reference signal;

a second comparator arranged to receive a second feedback signal and the second modulated reference signal and generate a corresponding second error signal indicative of a difference between the second modulated reference signal and the second feedback signal;

a second integration stage arranged to integrate the second error signal from the second comparator to generate a second integrated digital error signal;

a second summer arranged to receive the second integrated digital error signal and the inverted digital data signal and generate a second adjusted digital data signal indicative of their sum;

a second output stage comprising a fourth modulation stage, the second output stage being arranged to receive the second adjusted digital data signal and to generate a corresponding second modulated output signal for driving a load; and a second feedback circuit arranged to provide said second feedback signal to the second comparator, wherein the second modulated output signal is a second modulated voltage for application to a second side of the load, and the second feedback signal is indicative of the second modulated voltage.

18. A digital amplifier according to claim 17, wherein the first and second output stages comprise an H-bridge circuit for driving an output load.

\* \* \* \* \*